(12) United States Patent
Schwan et al.

(10) Patent No.: US 7,556,996 B2
(45) Date of Patent: Jul. 7, 2009

(54) FIELD EFFECT TRANSISTOR COMPRISING A STRESSED CHANNEL REGION AND METHOD OF FORMING THE SAME

(75) Inventors: Christoph Schwan, Gebhardshain (DE); Joe Bloomquist, Austin, TX (US); Kai Frohberg, Niederau (DE); Manfred Horstmann, Duerrroehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 110 days.

(21) Appl. No.: 11/736,622

(22) Filed: Apr. 18, 2007

(65) Prior Publication Data

US 2008/0079039 A1 Apr. 3, 2008

(30) Foreign Application Priority Data

Sep. 29, 2006 (DE) .............. 10 2006 046 380

(51) Int. Cl.
*H01L 21/8238* (2006.01)

(52) U.S. Cl. ............... 438/199; 438/222; 257/E21.632

(58) Field of Classification Search ......... 438/197–199, 438/218, 222, 311; 257/E21.632
See application file for complete search history.

(56) References Cited

U.S. PATENT DOCUMENTS

| 6,399,970 | B2 | 6/2002 | Kubo et al. ............... 257/194 |
| 7,037,770 | B2 | 5/2006 | Chidambarrao et al. ..... 438/154 |
| 2002/0037619 | A1* | 3/2002 | Sugihara et al. ............ 438/289 |
| 2005/0139930 | A1* | 6/2005 | Chidambarrao et al. ..... 257/369 |
| 2008/0064160 | A1* | 3/2008 | Kim et al. ................... 438/233 |

OTHER PUBLICATIONS

German office action dated Jul. 25, 2007 for serial No. 102006046380.3-33.

* cited by examiner

*Primary Examiner*—Hoai V Pham
(74) *Attorney, Agent, or Firm*—Williams, Morgan & Amerson, P.C.

(57) ABSTRACT

A method of forming a field effect transistor comprises providing a substrate comprising, at least on a surface thereof, a first semiconductor material. A recess is formed in the substrate. The recess is filled with a second semiconductor material. The second semiconductor material has a different lattice constant than the first semiconductor material. A gate electrode is formed over the recess filled with the second semiconductor material.

6 Claims, 8 Drawing Sheets

FIELD EFFECT TRANSISTOR COMPRISING A STRESSED CHANNEL REGION AND METHOD OF FORMING THE SAME

BACKGROUND OF THE INVENTION

1. Field of the Invention

The present disclosure generally relates to the formation of integrated circuits, and, more particularly, to the formation of semiconductor structures comprising field effect transistors having stressed channel regions.

2. Description of the Related Art

Integrated circuits comprise a large number of individual circuit elements, such as transistors, capacitors and resistors. These elements are connected internally to form complex circuits such as memory devices, logic devices and microprocessors. The performance of integrated circuits can be improved by increasing the number of functional elements in the circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They provide a means to control a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and on the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source region and in the drain region in order to provide a low sheet resistivity and a low contact resistivity in combination with a desired channel controllability.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive stress. This leads to a modified mobility of electrons and holes, respectively. Depending on the magnitude of the stress, a compressive stress may significantly increase the mobility of holes in a silicon layer. The mobility of electrons may be increased by providing a silicon layer having a tensile stress.

A method of forming a field effect transistor wherein the channel region is formed in stressed silicon will be described in the following with reference to FIGS. 1a-1d. FIG. 1a shows a schematic cross-sectional view of a semiconductor structure 100 in a first stage of a manufacturing process according to the state of the art. The semiconductor structure 100 comprises a substrate 101. In the substrate 101, an active region 104 is provided. A trench isolation structure 102 separates the active region 104 from other elements of the semiconductor structure 100 which are not shown in FIG. 1a. A gate electrode 106 which is separated from the substrate 101 by a gate insulation layer 105 is formed over the substrate 101. The gate electrode 106 is covered by a cap layer 107 and flanked by first sidewall spacers 108, 109. The active region 104, the trench isolation structure 102, the gate electrode 106, the gate insulation layer 105, as well as the first sidewall spacers 108, 109 and the cap layer 107, together form portions of a field effect transistor element 130.

In the formation of the semiconductor structure 100, the substrate 101 is provided and the trench isolation structure 102 is formed by means of methods of photolithography, etching, deposition and/or oxidation processes known to persons skilled in the art. Then, ions of a dopant material are implanted into the substrate 101 in order to form the active region 104. The type of dopants corresponds to the doping of the channel region of the field effect transistor to be formed. Hence, in the formation of an N-type transistor, ions of a P-type dopant are implanted, whereas ions of an N-type dopant are implanted in the formation of a P-type transistor.

After the formation of the active region 104, an oxidation process is performed to form the gate insulation layer 105. Thereafter, the gate electrode 106 and the cap layer 107 are formed by deposition, etching and photolithography processes that are well known to persons skilled in the art. Subsequently, the first sidewall spacers 108, 109 are formed by depositing a layer of a spacer material and performing an anisotropic etch process wherein portions of the layer of spacer material over substantially horizontal portions of the semiconductor structure 100 are removed, whereas portions of the layer of spacer material provided on the sidewalls of the gate electrode 106 remain on the substrate 101 and form the first sidewall spacers 108, 109.

A schematic cross-sectional view of the semiconductor structure 100 in a later stage of the manufacturing process according to the state of the art is shown in FIG. 1b. As shown therein, an etch process is performed. The etch process can be an isotropic etch process adapted to selectively remove the material of the substrate 101, leaving the material of the cap layer 107 and the first sidewall spacers 108, 109 substantially intact, for example, a known dry etch process. The cap layer 107 and the first sidewall spacers 108, 109 protect the gate electrode 106, the gate insulation layer 105 and a channel region 140 below the gate electrode 106 from being affected by an etchant used in the etch process.

Portions of the substrate 101 adjacent the gate electrode 106, however, are etched away. Thus, a source side cavity 110 and a drain side cavity 111 are formed adjacent the gate electrode 106. Due to the isotropy of the etch process, portions of the substrate 101 below the first sidewall spacers 108, 109 and, optionally, portions of the substrate 101 below the gate electrode 106 are removed. Therefore, the cavities 110, 111 may extend below the sidewall spacers 108, 109 and/or the gate electrode 106, the surface 150, 151 of the cavities 110, 111 having a somewhat rounded shape.

After the etch process, the cavities 110, 111 may have a rough surface 150, 151. If a stress-creating material were deposited over the substrate 101 in order to fill the cavities 110, 111 as described below, unevenness on the bottom surface of the cavities 110, 111 would act as nucleation sites, leading to an undesirable polycrystalline growth of the stress-creating material. Therefore, a process is performed to reduce the roughness of the surface 150, 151 of the cavities.

The roughness reduction process can be a high temperature prebake process wherein the semiconductor structure 100 is exposed to a temperature in a range from about 800-1000° C. for about 30 seconds to about 10 minutes. During the prebake process, the semiconductor structure 100 can be provided in an ambient comprising hydrogen gas which substantially does not react chemically with the materials of the semiconductor structure 100. The high temperature prebake process leads to a diffusion of atoms on the surface of the cavities 110, 111. Due to the diffusion, a material transport may occur which leads to roughness reduction of the surface of the cavities 110, 111.

FIG. 1c shows a schematic cross-sectional view of the semiconductor structure 100 in yet another stage of the manufacturing process. Stress-creating elements 114, 115 are formed adjacent the gate electrode 106. To this end, the cavities 110, 111 are filled with a layer of a stress-creating material. In methods of forming a field effect transistor according to the state of the art, the stress-creating material may comprise silicon germanide. As persons skilled in the art know, silicon germanide is an alloy of silicon (Si) and germanium (Ge). Other materials may be employed as well.

Silicon germanide is a semiconductor material having a greater lattice constant than silicon. When silicon germanide is deposited in the cavities 110, 111, however, the silicon and germanium atoms in the stress-creating elements 114, 115 tend to adapt to the lattice constant of the silicon in the substrate 101. Therefore, the lattice constant of the silicon germanide in the stress-creating elements 114, 115 is smaller than the lattice constant of a bulk silicon germanide crystal. Thus, the material of the stress-creating elements 114, 115 is compressively stressed.

The stress-creating elements 114, 115 can be formed by means of selective epitaxial growth. As persons skilled in the art know, selective epitaxial growth is a variant of plasma enhanced chemical vapor deposition wherein parameters of the deposition process are adapted such that material is deposited only on the surface of the substrate 101 in the cavities 110, 111, whereas substantially no material deposition occurs on the surface of the first sidewall spacers 108, 109 and the cap layer 107.

Since the stress-creating elements 114, 115 are compressively stressed, they exhibit a force to portions of the substrate 101 in the vicinity of the gate electrode 106, in particular to portions of the substrate 101 in the channel region 140. Therefore, a compressive stress is created in the channel region 140.

FIG. 1d shows a schematic cross-sectional view of the semiconductor structure 100 in yet another stage of the manufacturing process according to the state of the art. After the formation of the stress-creating elements 114, 115, the first sidewall spacers 108, 109 are removed. Additionally, the cap layer 107 may be removed. Thereafter, an extended source region 116 and an extended drain region 117 are formed in portions of the substrate 101 and the stress-creating elements 114, 115 by means of an ion implantation process known to persons skilled in the art. In the ion implantation process, ions of a dopant material are introduced into the substrate 101 and the stress-creating elements 114, 115. In case of the formation of an N-type field effect transistor, ions of an N-type dopant are introduced, whereas ions of a P-type dopant are provided in the formation of a P-type transistor.

Subsequently, second sidewall spacers 118, 119 are formed adjacent the gate electrode 106. Thereafter, a further ion implantation process is performed to form a source region 120 and a drain region 121 by introducing dopant material ions. Finally, an annealing process may be performed to activate the dopant materials introduced in the formation of the extended source region 116, the extended drain region 117, the source region 120 and the drain region 121.

One problem associated with the above method of forming a field effect transistor according to the state of the art is that N-type field effect transistors and P-type field effect transistors, which may both be present in modern integrated circuits, may require stress of a different type in the channel region. While the performance of P-type field effect transistors may be considerably improved by providing a compressively stressed channel region, a compressive stress may not improve the performance of N-type field effect transistors or may even be detrimental to the performance of N-type field effect transistors. Conversely, a tensile stress may improve the performance of N-type field effect transistors but may be detrimental to the performance of P-type field effect transistors.

Attempts to apply the above-described method of forming a field effect transistor in the formation of semiconductor structures having compressively stressed P-type field effect transistors and N-type field effect transistors having a tensile stress have led to complex and, therefore, expensive manufacturing processes.

A further problem associated with the above method of forming a field effect transistor according to the state of the art is that the gate electrode 106 and the gate insulation layer 105 may be exposed to elevated temperatures, in particular in the roughness reduction process performed in order to smoothen the bottom surfaces 150, 151 of the cavities 110, 111. Since, in modern field effect transistors, the gate insulation layer 105 may be thin, such elevated temperatures may adversely influence the functionality of the gate insulation layer 105.

Yet another problem associated with the above method of forming a field effect transistor according to the state of the art is that, due to the distance between the stress-creating elements 114, 115 and the channel region 140, the stress in the channel region 140 may be smaller than the stress in the stress-creating elements 114, 115. This may reduce the enhancement of the charge carrier mobility which can be obtained.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment disclosed herein, a method of forming a field effect transistor comprises providing a substrate comprising, at least on a surface thereof, a first semiconductor material. A recess is formed in the substrate. The recess is filled with a second semiconductor material. The second semiconductor material has a different lattice constant than the first semiconductor material. A gate electrode is formed over the recess filled with the second semiconductor material.

According to another illustrative embodiment disclosed herein, a method of forming a semiconductor structure comprises providing a substrate comprising, at least on a surface thereof, a first semiconductor material, a layer of a second semiconductor material being formed over the surface. A portion of the layer of second semiconductor material located over a first portion of the substrate is removed, whereas a portion of the layer of second semiconductor material located over a second portion of the substrate is not removed. A first recess is formed in the first portion of the substrate. A second recess is formed in the layer of second semiconductor material over the second portion of the substrate. The first recess and the second recess are filled with a third semiconductor material. A first gate electrode is formed over the first recess and a second gate electrode is formed over the second recess.

According to yet another illustrative embodiment disclosed herein, a semiconductor structure comprises a substrate. The substrate comprises, at least on a surface thereof, a first semiconductor material. The semiconductor structure further comprises a field effect transistor. The field effect transistor comprises a recess provided in the substrate and a gate electrode. The recess is filled with a second semiconductor material. The gate electrode is provided over the recess filled with the second semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1A:
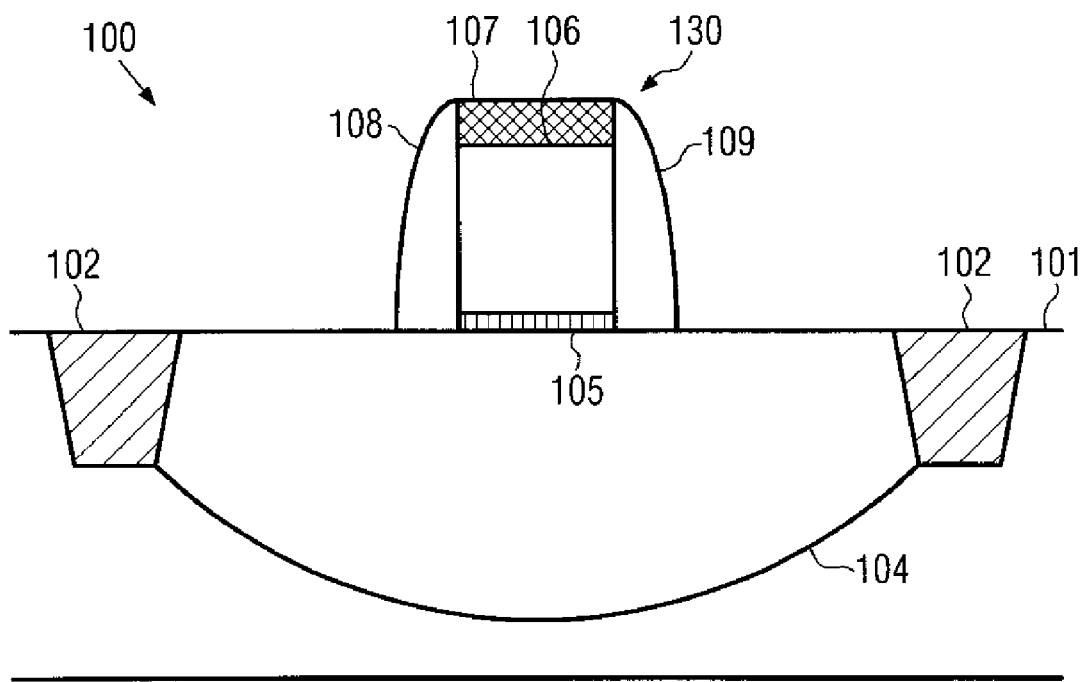
FIGS. 1a-1d show schematic cross-sectional views of a semiconductor structure in stages of a manufacturing process according to the state of the art.
Figure 1B:
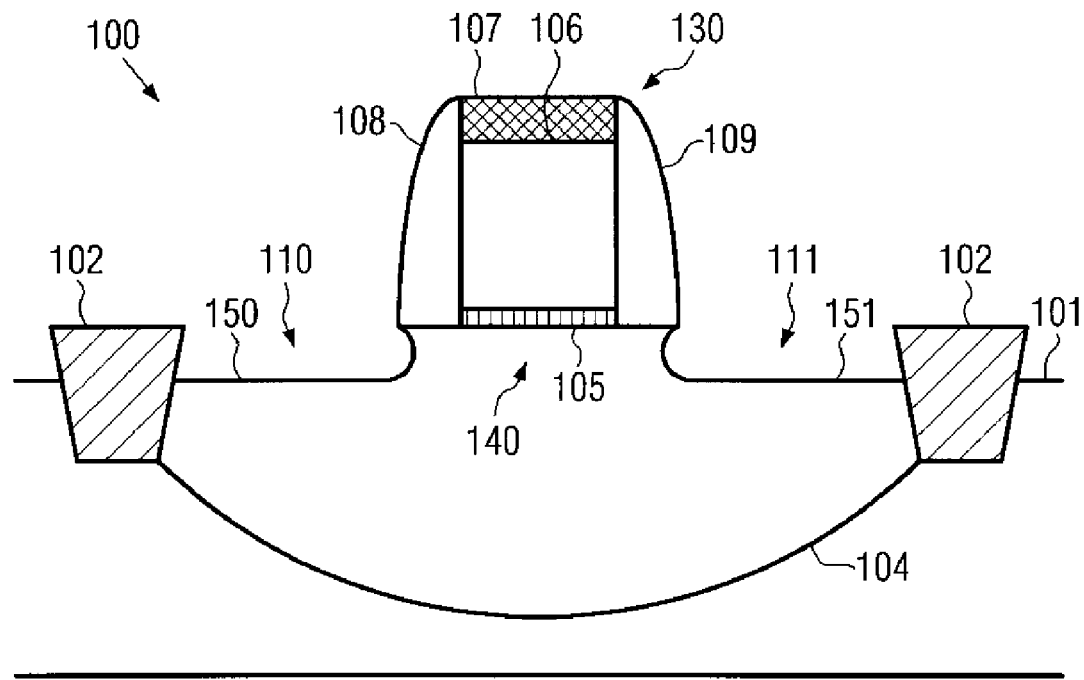
Figure 1C:
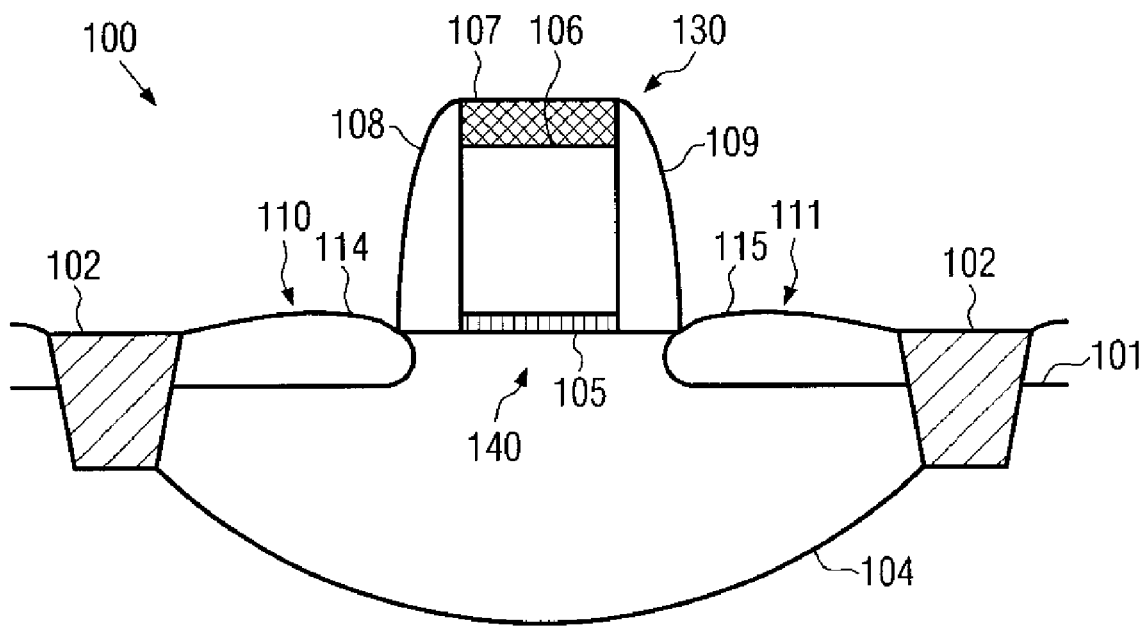
Figure 1D:
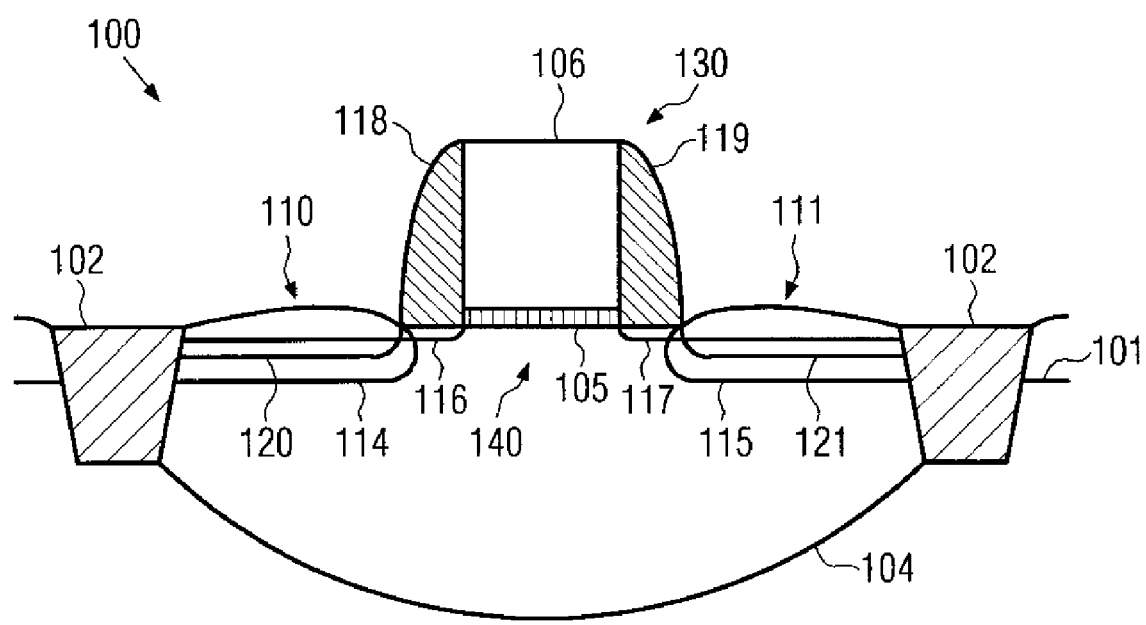

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In some embodiments disclosed herein, stress in the channel regions of field effect transistors is created by providing channel regions comprising a different semiconductor material than portions of the substrate adjacent and/or below the channel regions. The channel regions can be formed by filling recesses in a substrate with a material which is different from the substrate material and forming gate electrodes over the recesses. If a material having a lattice constant which is smaller than the lattice constant of the material of the channel region is provided below the channel region, a compressive stress can be created in the channel region. Providing a material having a lattice constant which is greater than the lattice constant of the material of the channel region below the channel region may lead to the formation of a tensile stress in the channel region.

If, however, a material having a lattice constant different from the lattice constant of the material in the channel region is provided in source and drain regions adjacent the channel region, a compressively stressed channel region may be obtained if the lattice constant of the source and drain material is greater than the lattice constant of the material of the channel region. Conversely, a tensile stress may be obtained if the lattice constant of the material of the channel region is smaller than the lattice constant of the material of the source and drain regions.

In embodiments wherein the channel region of a field effect transistor is formed by filling a recess with a material having a different lattice constant than the substrate material, an influence of the material adjacent the channel region on the stress state of the channel region may be greater than an influence of the material below the channel region. Therefore, a compressive stress in the channel region of a field effect transistor can be obtained by filling the recess below its gate electrode with a material having a smaller lattice constant than the substrate material. Conversely, tensile stress in the channel region may be obtained by filling the recess below its gate electrode with a material having a greater lattice constant than the substrate material.

In some embodiments disclosed herein, the channel region may comprise silicon. Tensile stress in the channel region may be obtained by forming a silicon channel region in a substrate portion comprising silicon carbide, while compressive stress in a silicon channel region can be obtained by forming the channel region in a substrate portion comprising silicon germanide. The stress in the channel region may further be varied by forming the channel in a stressed substrate portion, for example in a layer of a material which comprises an intrinsic stress.

Figure 2A:
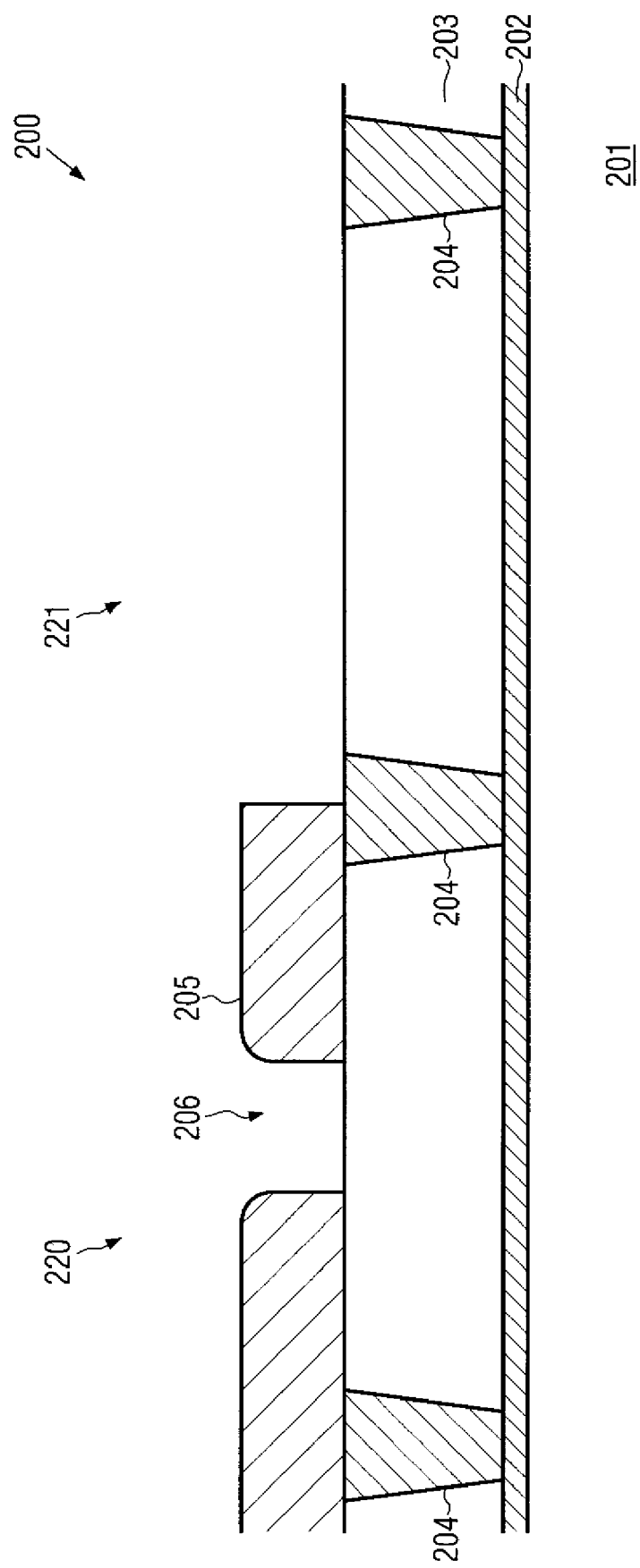
FIGS. 2a-2c show schematic cross-sectional views of a semiconductor structure in stages of a manufacturing process according to an embodiment disclosed herein.

FIG. 2a shows a schematic cross-sectional view of a semiconductor structure 200 in a first stage of a manufacturing process. The semiconductor structure 200 comprises a substrate 201. The substrate 201 comprises a layer 202 of an electrically insulating material and a layer 203 of a first semiconductor material formed over the substrate 201. Thus, the substrate 201 comprises, on a surface thereof, the first semiconductor material 203. The substrate 201 further comprises a trench isolation structure 204 which provides electrical insulation between a first portion 220 and a second portion 221 of the semiconductor structure 200. A mask 205 covering the first portion 220 of the semiconductor structure 200 and having an opening 206 is formed over the semiconductor structure 200.

In the formation of the semiconductor structure 200, first the substrate 201 may be provided. The substrate 201 may comprise a semiconductor material, for example, silicon. On the substrate 201, the layer 202 of electrically insulating material can be formed, for example by oxidizing the substrate 201 and/or by performing a deposition process of a type well known to persons skilled in the art, such as chemical vapor deposition (CVD) or plasma enhanced chemical vapor deposition (PECVD).

The formation of the layer 203 of the first semiconductor material may comprise bonding an auxiliary substrate (not shown) to the substrate 201. The auxiliary substrate comprises the first semiconductor material. In some embodiments, the first semiconductor material can be a material having a lattice constant greater than the lattice constant of silicon, for example, silicon germanide. In other embodiments, the first semiconductor material can be a material having a smaller lattice constant than silicon, for example, silicon carbide. In still further embodiments, materials other than silicon germanide and silicon carbide may be employed. Bonding techniques well known to persons skilled in the art, such as anodic bonding, may be used for bonding the auxiliary substrate to the substrate 201. Thereafter, the auxiliary substrate can be cleaved. A portion of the auxiliary substrate remaining on the substrate 201 after the cleaving process forms the layer 203 of the first semiconductor material.

An implantation of hydrogen into the auxiliary substrate 203 may be performed before bonding the auxiliary substrate 203 to the substrate 201. To this end, a surface of the auxiliary substrate can be irradiated with hydrogen ions. The hydrogen ions penetrate the auxiliary substrate and are stopped at a depth which may depend on the energy of the ions and their angle of incidence. Then, the ions are neutralized and incorporated into the auxiliary substrate. Ion energy and/or angle of incidence are adapted such that a moderately large amount of hydrogen is incorporated at a depth corresponding to the desired thickness of the layer 203 of the first semiconductor material.

After the implantation of the hydrogen ions, the irradiated surface of the auxiliary substrate is brought into contact with the layer 202 of electrically insulating material, and the bonding process is performed. Subsequently, the auxiliary substrate is cleaved, for example, by directing a high pressure water jet to the semiconductor structure 200. Since the presence of hydrogen reduces the mechanical stability of the auxiliary substrate, the auxiliary substrate breaks apart at the depth to which the hydrogen was implanted.

The layer 202 of electrically insulating material need not be provided. In other embodiments, the layer 203 of the first semiconductor material may be formed on the substrate 201 without there being an intermediate layer of insulating material. In such embodiments, the layer 203 may be formed by bonding an auxiliary substrate comprising the first semiconductor material to the substrate 201, wherein no layer of insulating material is provided on the substrate 201.

Forming the layer 203 by means of a bonding process may allow providing the layer 203 of the first semiconductor material with a low intrinsic stress or substantially no intrinsic stress at all.

Alternatively, the layer 203 of the first semiconductor material may be formed by means of a deposition process known to persons skilled in the art, for example, by means of chemical vapor deposition and/or plasma enhanced chemical vapor deposition. In embodiments wherein the first semiconductor material has a different lattice constant than the material of the substrate 201, forming the layer 203 of the first semiconductor material by means of a deposition process may lead to a creation of an intrinsic stress in the layer 203.

Particles deposited on the substrate 201 tend to adapt to the structure of the crystal lattice of the substrate 201. Hence, the lattice constant of the first semiconductor material 203 when deposited on the substrate 201 may differ from the lattice constant of the first semiconductor material in a bulk crystal. If the first semiconductor material has a greater bulk lattice constant than the material of the substrate 201, the atoms in the layer 203 may arrange at a smaller distance than in a bulk crystal. Thus, the layer 203 of the first semiconductor material is subject to a compressive stress. For example, this can be the case if the substrate 201 is comprised of silicon and the layer 203 is comprised of silicon germanide.

Conversely, if the first semiconductor material has a smaller bulk lattice constant than the material of the substrate 201, the atoms in the layer 203 may arrange at a greater distance than in a bulk crystal of the first semiconductor material, and the layer 203 may be subject to a tensile stress. For example, this can be the case if the substrate 201 is comprised of silicon and the layer 203 is comprised of silicon carbide.

In some embodiments, the layer 203 may be processed to induce a relaxation of intrinsic stress in the layer 203. To this end, the layer 203 may be irradiated with ions and/or may be annealed. Thereby, lattice defects may be formed in the layer 203. The presence of lattice defects allows the inter-atomic spacing in the layer 203 to more closely resemble the inter-atomic spacing in a bulk crystal of the first semiconductor material. Thus, the intrinsic stress in the layer 203 may be reduced.

Hence, the intrinsic stress in the layer 203 of the first semiconductor material may be controlled by a selection of the process employed in the formation of the layer 203 and/or by processing the layer 203.

After the formation of the layer 203 of the first semiconductor material, the trench isolation structure 204 is formed in the layer 203 of the first semiconductor material. For this purpose, processes of photolithography, etching, oxidation and/or deposition well known to persons skilled in the art can be used.

In some embodiments, neither the layer 202 of electrically insulating material nor the layer 203 of the first semiconductor material are formed. Instead, the substrate 201 can be a bulk substrate comprised of the first semiconductor material.

The mask 205 is formed over the semiconductor structure 200. The mask 205 comprises an opening 206 located in the first portion 220 of the semiconductor structure 200. The mask 205 need not extend over the second portion 221 of the semiconductor structure 221. Thus, the layer 203 of the first semiconductor material can be exposed in the second portion 221. The mask 205 may comprise a photoresist. In other embodiments, the mask 205 can be a hard mask which may, for example, comprise silicon dioxide, silicon nitride and/or silicon oxynitride.

An etching process adapted to remove portions of the first semiconductor material 203 is performed. An etchant used in the etching process is selected such that the material of the mask 205 is substantially not affected by the etchant, or is affected by the etchant to a less extent than the first semiconductor material. Thus, the mask 205 protects portions of the layer 203 below the mask 205 from being affected by the etchant.

In one embodiment, the etching process can be a dry etching process. As persons skilled in the art know, in dry etching, which is also known as plasma etching, reactive ion etching or ion enhanced etching, a radio frequency glow discharge produces a chemically reactive species such as atoms, radicals and ions from a relatively inert molecular gas. The etching gas is selected such that a generated species reacts chemically with the material to be etched, creating a volatile reaction product.

Figure 2B:
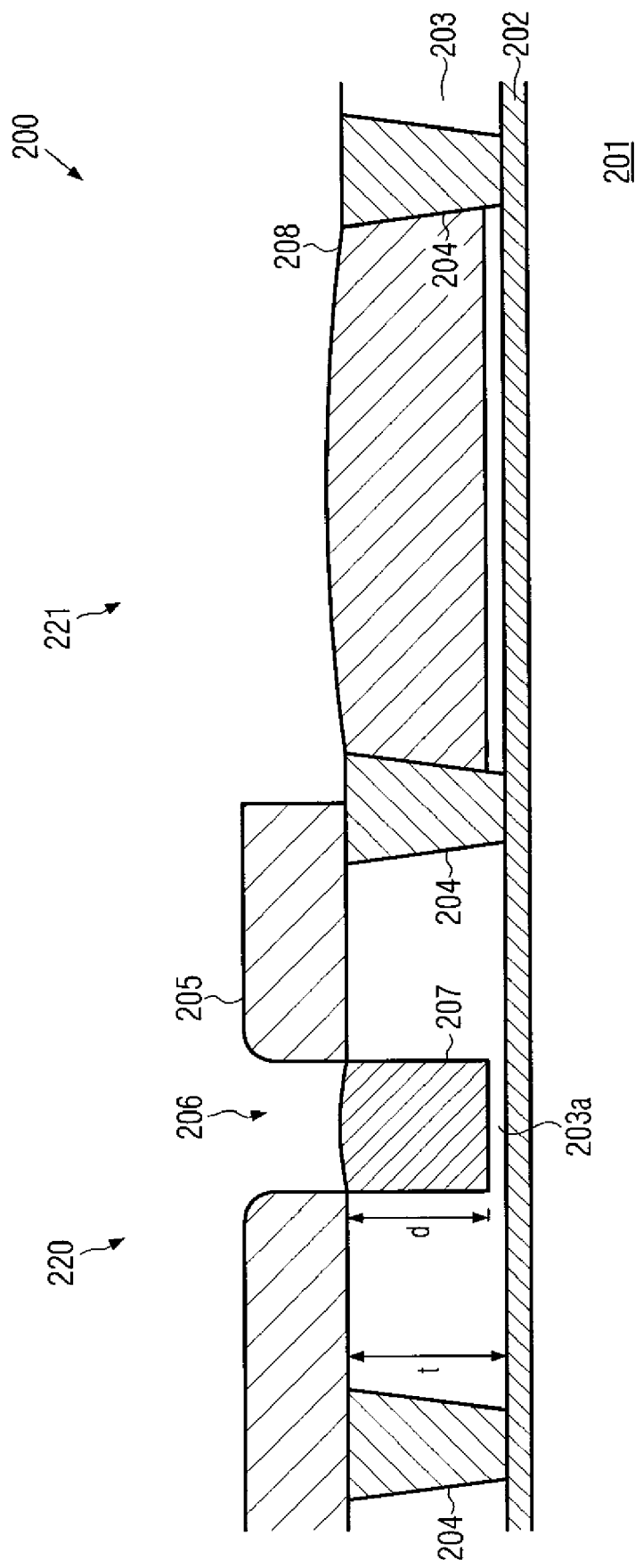

In the etching process, material is removed from portions of the layer 203 of the first semiconductor material below the opening 206 and in the second portion 221 of the semiconductor structure 200. Thus, the thickness of the layer 203 in these portions is reduced and a recess 207 (FIG. 2b) is formed in the layer 203 below the opening 206. The etching process may be stopped before the portions of the layer 203 below the opening 206 and in the second portion 221 of the semiconductor structure 200 are completely removed. Thus, a depth "d" of the recess is smaller than a thickness "t" of the layer 203 and a thin layer 203a of the first semiconductor material remains at the bottom of the recess 207 and in the second portion 221 of the semiconductor structure 200. A thickness t–d of the layer of the first semiconductor material at the bottom of the recess may have a value in a range from about 50-200 Å, in particular a value of about 100 Å.

A deposition process adapted to deposit a second semiconductor material 208 is performed. The second semiconductor material can be a material having a different lattice constant than the first semiconductor material 203. In embodiments wherein the first semiconductor material 203 comprises silicon germanide or silicon carbide, the second semiconductor material can comprise silicon.

In some embodiments, the second semiconductor material 208 can be deposited by means of a selective epitaxial growth process. As persons skilled in the art know, selective epitaxial growth is a variant of plasma enhanced chemical vapor deposition wherein parameters of the deposition process, such as temperature, pressure and composition of the reactant gas, as well as power and frequency of a radio-frequency alternating voltage applied during the deposition process, are adapted such that material deposition occurs on the portions of the layer 203 of the first semiconductor material exposed at the sidewalls and the bottom of the recess 207 as well as in the second portion 221 of the semiconductor structure 200, whereas substantially no material is deposited on the mask 205 and the trench isolation structure 204. Thus, the recess 207 is filled with the second semiconductor material, and a layer 208 of the second semiconductor material is formed in the second portion 221 of the semiconductor structure 200.

When the second semiconductor material 208 is deposited over the first semiconductor material on the bottom and on the sidewalls of the recess 207, as well as over the first semiconductor material in the second portion 221 of the semiconductor structure 200, the arrangement of the atoms of the second semiconductor material 208 may be influenced by the crystal lattice of the first semiconductor material. Thus, the distance between the atoms may be greater or smaller than the bulk lattice constant of the second semiconductor material, depending on the lattice constant of the first semiconductor material and, possibly, further parameters such as the orientation of interfaces between the first semiconductor material and the second semiconductor material. Therefore, the second semiconductor material may be subject to a tensile or compressive stress.

The second semiconductor material in the recess 207 can be influenced both by the first semiconductor material 203 at the sidewalls of the recess 207 and the first semiconductor material 203 at the bottom of the recess. Conversely, the layer 208 of second semiconductor material may be influenced only by the layer of first semiconductor material 203 in the second portion 221 of the semiconductor structure 200, which is located below the layer 208 and has a thickness which may be much smaller than the thickness of the layer 208.

In embodiments wherein the first semiconductor material 203 has a greater lattice constant than the second semiconductor material 208, which may, for example, be the case if the first semiconductor material comprises silicon germanide and the second semiconductor material comprises silicon, the second semiconductor material in the recess 207 may be subject to a compressive stress. The influence of the first semiconductor material adjacent the recess 207, which may lead to a creation of a compressive stress, may be greater than the influence of the first semiconductor material at the bottom of the recess. Hence, the compressive stress created by the first semiconductor material 203 adjacent the recess 207 may outweigh the tensile stress created by the first semiconductor material 203 at the bottom of the recess 207.

The second semiconductor material in the layer 208, however, may be substantially influenced only by the first semiconductor material 203 below the layer 208. Therefore, in embodiments wherein the lattice constant of the second semiconductor material 208 is smaller than the lattice constant of the first semiconductor material, a tensile stress may be created in the layer 208.

Conversely, in embodiments wherein the lattice constant of the second semiconductor material 208 is greater than the lattice constant of the first semiconductor material 203, for example, in embodiments wherein the first semiconductor material comprises silicon carbide and the second semiconductor material comprises silicon, a tensile stress may be created in the second semiconductor material in the recess 207 and a compressive stress may be created in the layer 208 of second semiconductor material. Hence, the layer 208 and the semiconductor material in the recess 207 may be differently stressed.

The stress of the second semiconductor material in the recess 207 and in the layer 208 may further be influenced by the stress of the first semiconductor material. An intrinsic tensile stress of the first semiconductor material may enhance the tensile stress created in the second semiconductor material 208, whereas an intrinsic compressive stress of the first semiconductor material 203 may reduce the tensile stress created in the second semiconductor material 208. Conversely, a tensile stress of the first semiconductor material 203 may reduce the compressive stress of the second semiconductor material 208, whereas a compressive stress of the first semiconductor material 203 may enhance the compressive stress of the second semiconductor material 208. Hence, the stress state of the second semiconductor material 208 in the recess 207 may be controlled by varying the intrinsic stress of the first semiconductor material 203, which may be done by correspondingly adapting the processes used in the formation of the layer 203 and/or by processing the layer 203, as detailed above.

Figure 2C:
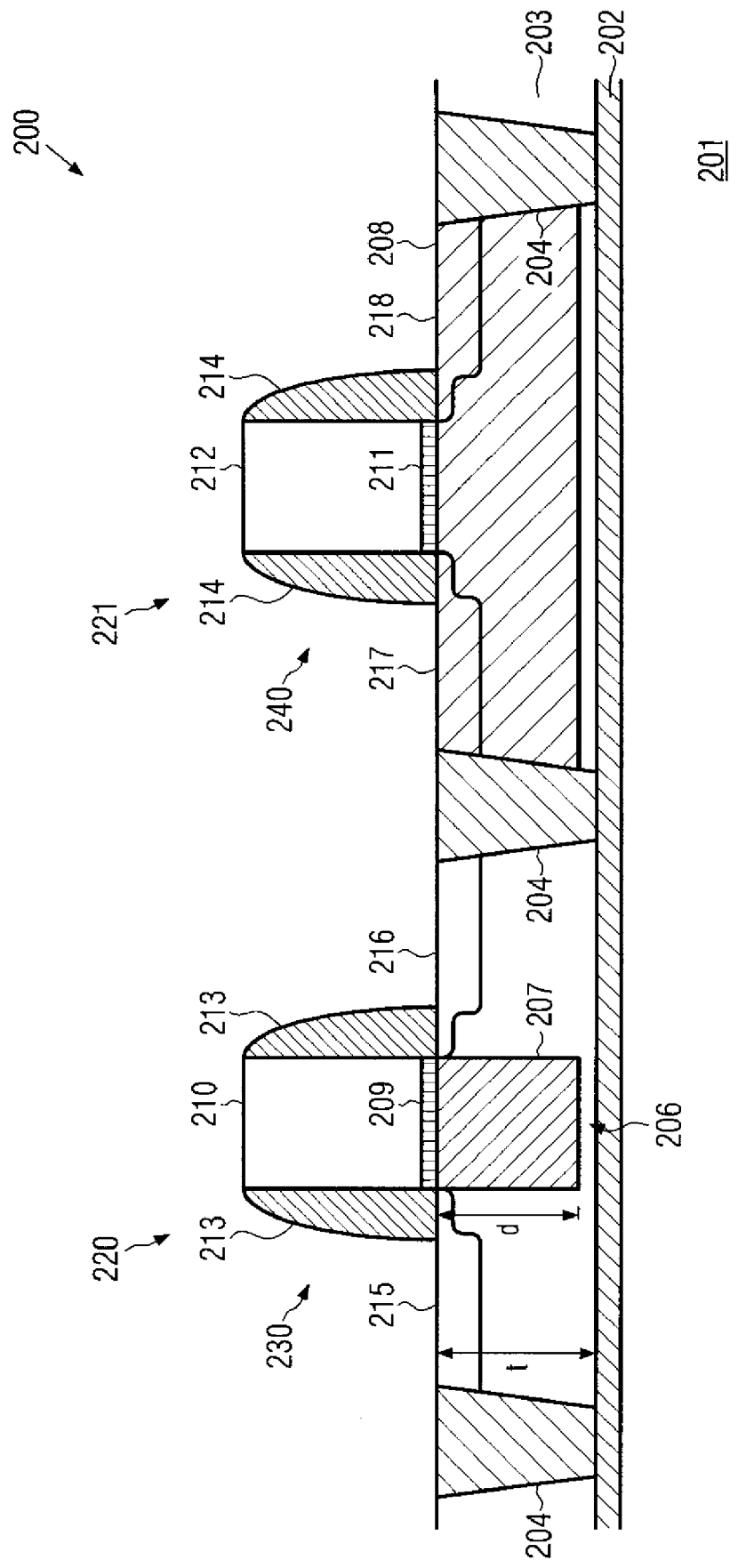

FIG. 2c shows a schematic cross-sectional view of the semiconductor structure 200 in a further stage of the manufacturing process. After the deposition of the second semiconductor material 208, the mask 205 can be removed from the semiconductor structure 200. In embodiments wherein the mask 205 comprises a photoresist, this can be done by means of a known resist strip process. In other embodiments, wherein the mask 205 is a hard mask, the mask 205 may be removed by means of an etching process adapted to selectively remove the material of the mask 205, leaving the first semiconductor material 203, the second semiconductor material 208 and a material of the trench isolation structure 204 substantially intact.

In some embodiments, a planarization process, for example a chemical mechanical polishing process, may be performed after the deposition of the second semiconductor material 208. As persons skilled in the art know, in chemical mechanical polishing, the semiconductor structure 200 is moved relative to a polishing pad. A slurry comprising a chemical compound reacting chemically with materials on the surface of the semiconductor structure 100 is supplied to an interface between the polishing pad and the semiconductor structure 200. Products of the chemical reaction are removed by abrasives in the slurry and/or the polishing pad.

In the planarization process, unevenness of the surface of the semiconductor structure 200, which may, for example, be created during the deposition of the second semiconductor material 208, may be removed or reduced. Thus, a substantially flat surface of the semiconductor structure 200 may be obtained.

In some embodiments, the mask 205 is not removed prior to the planarization process. In such embodiments, the mask 205 may be removed during the planarization of the semiconductor structure 200. Thus, the number of process steps required for the manufacturing of the semiconductor structure 200 may be advantageously reduced.

In still further embodiments, the second semiconductor material 208 may be deposited by means of a non-selective deposition process, wherein the second semiconductor material 208 is deposited on the mask 205 and/or the trench isolation structure 204 in addition to the recess 207 and the second portion 221 of the semiconductor structure 200. In such embodiments, the planarization process may be used to remove both the mask 205 and the second semiconductor material 208 deposited thereon.

In the first portion 220 of the semiconductor structure, a first field effect transistor 230 is formed. To this end, a gate electrode 210 is provided over the recess 207 in the first portion 220 of the semiconductor structure 200. A gate insulation layer 209 separates the first gate electrode 210 from the second semiconductor material in the recess 207. In the second portion 221 of the semiconductor structure 200, a second field effect transistor 240 is formed. The second field effect transistor 240 comprises a second gate electrode 212 separated from the layer 208 of second semiconductor material by a gate insulation layer 208.

The first gate electrode 210 and the second gate electrode 212, as well as the gate insulation layers 209, 211, may be formed by means of methods of oxidation, deposition, photolithography and etching well known to persons skilled in the art. Advanced known alignment processes may be used in order to substantially align the first gate electrode 210 with the recess 207.

After the formation of the first gate electrode 210 and the second gate electrode 212, a source region 215 and a drain region 216, as well as a sidewall spacer structure 212, may be formed adjacent the first gate electrode 210. Similarly, a source region 217, a drain region 218 and a sidewall spacer structure 214 may be formed adjacent the second gate electrode 212. This can be done by means of well known techniques of ion implantation, deposition and etching.

Channel regions of the first field effect transistor 230 and the second field effect transistor 240 are located in the recess 207 filled with the second semiconductor material and in the layer 208 of the second semiconductor material, respectively. Thus, the channel regions of the field effect transistors may be stressed, wherein the stress in the channel region of the first field effect transistor can be different from the stress in the channel region of the second field effect transistor.

The field effect transistors 230, 240 in the first portion 220 and the second portion 221 of the semiconductor structure 200 can be field effect transistors of a different type. For example, in embodiments wherein the first semiconductor material comprises silicon germanide and the second semiconductor material comprises silicon, the compressive stress of the silicon in the recess 207 may be employed to enhance the performance of the first field effect transistor 230, in particular if the first field effect transistor 230 is a P-type transistor. In such embodiments, the second field effect transistor can be an N-type transistor. Conversely, in embodiments wherein the first semiconductor material comprises silicon carbide and the second semiconductor material comprises silicon, the first field effect transistor 230 can be an N-type transistor and the second field effect transistor 240 can be a P-type transistor.

Figure 3A:
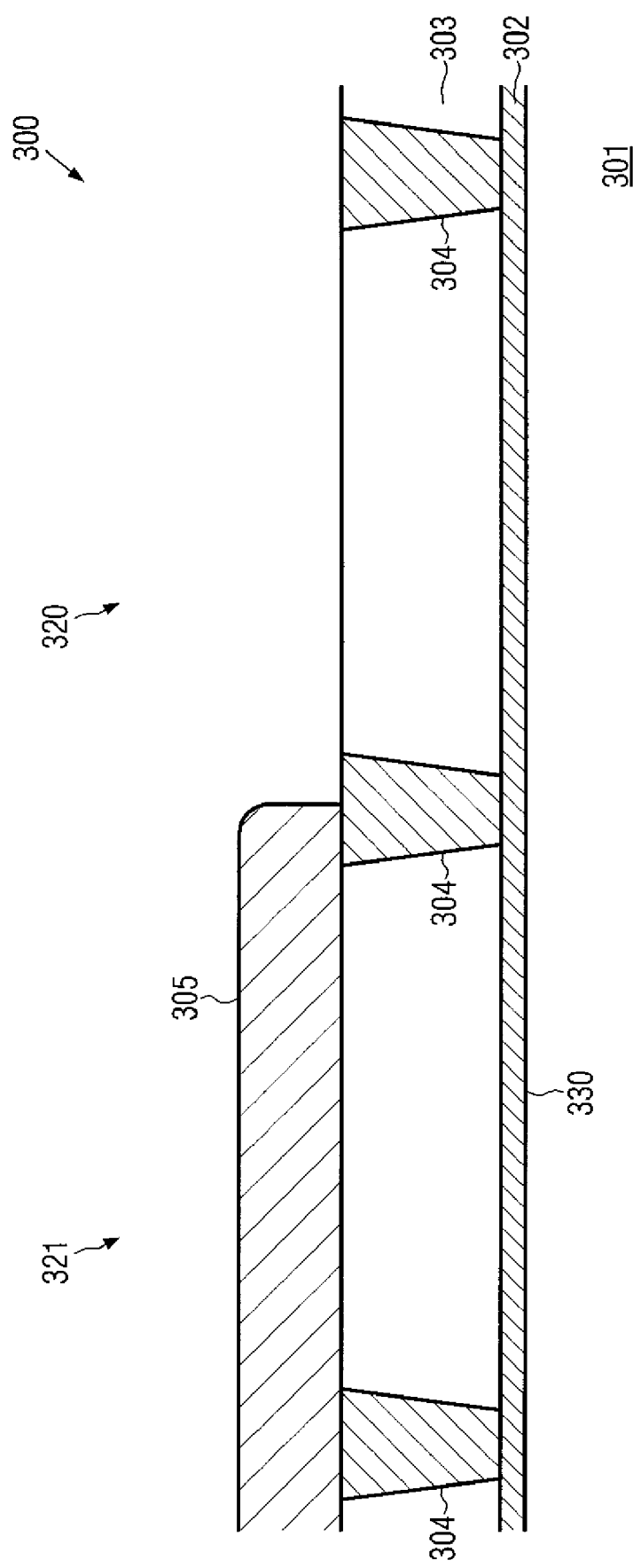
FIGS. 3a-3c show schematic cross-sectional views of a semiconductor structure in stages of a manufacturing process according to another embodiment disclosed herein.

FIG. 3a shows a schematic cross-sectional view of a semiconductor structure 300 in a first stage of a manufacturing process. The semiconductor structure 300 comprises a substrate 301. The substrate 301 comprises, at least on a surface 330 thereof, a first semiconductor material. In some embodiments, the first semiconductor material can be silicon germanide. In other embodiments, the first semiconductor material may be silicon carbide. Other materials may be employed as well.

In some embodiments, the substrate 301 can be a bulk substrate comprised of the first semiconductor material. In other embodiments, the substrate 301 can comprise a layer of the first semiconductor material formed on a surface of a wafer comprising a different material, for example, on a surface of a silicon wafer. In such embodiments, the layer 301 of the first semiconductor material may be formed by means of techniques of bonding and/or deposition, similar to the formation of the layer 203 in the embodiments described above with reference to FIGS. 2a-2c.

On the substrate 301, a layer 302 of an electrically insulating material, for example, silicon dioxide, silicon nitride and/or silicon oxynitride, can be provided. The layer 302 can be formed by means of known methods of deposition and/or oxidation. Over the layer 302, a layer 303 of a second semiconductor material is provided. The layer 303 can be formed by means of bonding and/or deposition techniques similar to those described above with reference to FIGS. 2a-2c, wherein an intrinsic stress of the layer 303 may be varied by adapting the technique employed in the formation of the layer 303 and/or by processing the layer 303. The second semiconductor material 303 can have a different composition than the first semiconductor material 301. For example, in embodiments wherein the first semiconductor material comprises silicon germanide, the second semiconductor material 303 may comprise silicon carbide. Conversely, in embodiments wherein the first semiconductor material 301 comprises silicon carbide, the second semiconductor material 303 may comprise silicon germanide. Other materials may be employed as well.

In some embodiments, the layer 302 of electrically insulating material may be omitted. In such embodiments, the layer 303 of second semiconductor material can be bonded to and/or deposited on the substrate 301 without there being an electrically insulating material between the substrate 301 and the layer 303 of the second semiconductor material.

In the layer 303 of the second semiconductor material, a trench isolation structure 304 is formed. The trench isolation structure 304 comprises one or more trenches filled with an electrically insulating material such as silicon dioxide and/or silicon nitride and provides electrical insulation between a first portion 320 and a second portion 321 of the semiconductor structure 300.

A first mask 305 is formed over the semiconductor structure 300. The first mask 305 covers the second portion 321 of the semiconductor structure 300 and does not cover the first portion 320 of the semiconductor structure 300. The first mask 305 can comprise a photoresist or may be a hard mask comprising, for example, silicon dioxide and/or silicon nitride. The first mask 305 can be formed by means of known methods of photolithography, deposition and/or etching.

Figure 3B:
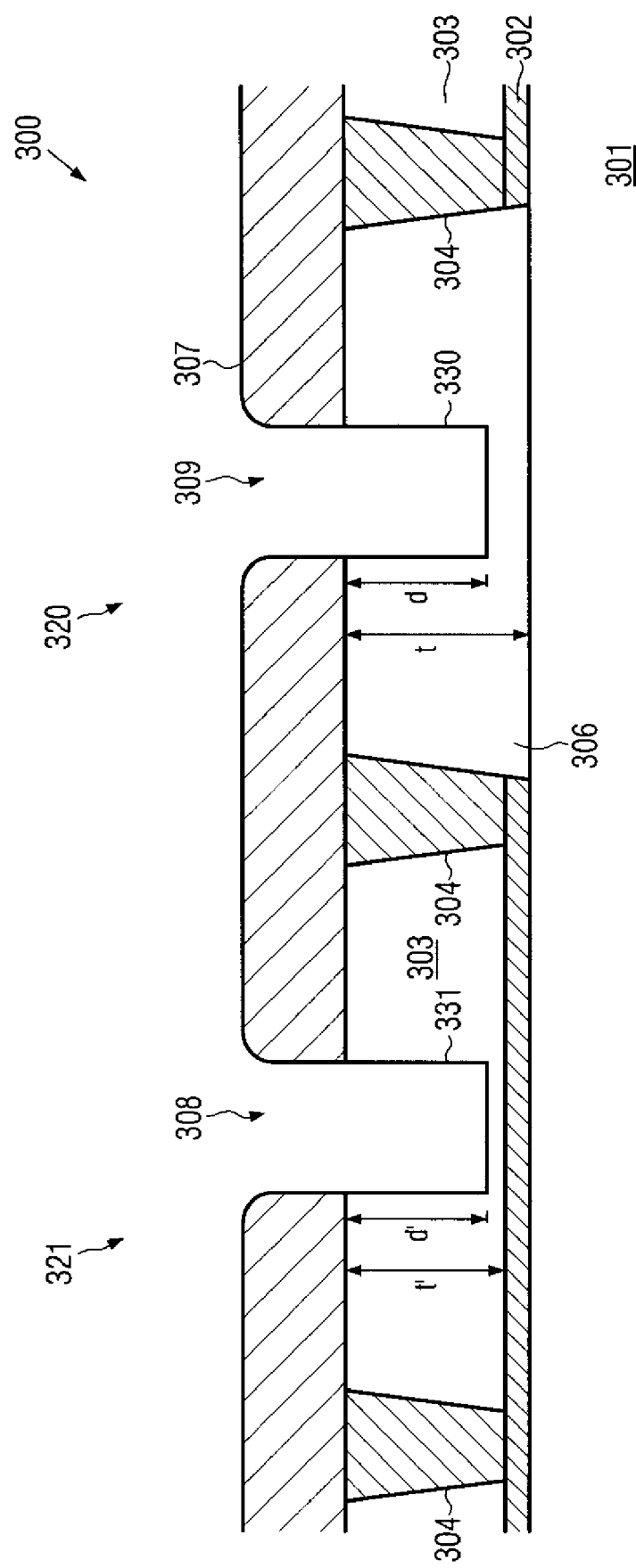

FIG. 3b shows a schematic cross-sectional view of the semiconductor structure 300 in a later stage of the manufacturing process. After the formation of the first mask 305, an etching process is performed. The etching process, which may in some embodiments be a dry etching process, is adapted to remove the second semiconductor material in the layer 303 and the electrically insulating material of the layer 302, leaving the material of the first mask 305 substantially intact or removing the material of the first mask 305 at a lower etch rate than the materials of the layers 302, 303. Thus, portions of the layers 302, 303 located in the first portion 320 of the semiconductor structure 300 are removed in the etching process, whereas the first mask 305 protects portions of the layers 302, 303 in the second portion 321 of the semiconductor structure 300 from being etched.

A layer 306 of the first semiconductor material is deposited over the first portion 320 of the semiconductor structure 300. In some embodiments, the layer 306 can be formed by means of a selective epitaxial growth process which is adapted such that the first semiconductor material is deposited on the substrate 301 exposed in the first portion 320 of the semiconductor structure 300, whereas substantially no deposition takes place on the first mask 305.

In other embodiments, the layer 306 may be formed by means of a non-selective growth process wherein deposition of the first semiconductor material also occurs on the mask 305. In such embodiments, the first semiconductor material deposited in the second portion 321 of the semiconductor structure 300, as well as the first mask 305, can be removed by means of a planarization process, for example, a chemical mechanical polishing process.

In embodiments wherein the layer 306 of the first semiconductor material is formed by means of a selective epitaxial growth process, the first mask 305 may be removed by means of a resist strip process known to persons skilled in the art or by means of a chemical mechanical polishing process. A planarization process such as chemical mechanical polishing may be performed to provide a planar surface of the semiconductor structure 300.

A first recess 330 is formed in the first portion 320 of the semiconductor structure 300 and a second recess 331 is formed in the second portion 331. To this end, a second mask 307 can be formed over the semiconductor structure 300. The second mask 307 comprises a first opening 309 and a second opening 308 which are located above portions of the semiconductor structure 300 wherein the recesses 330, 331 are to be formed. Thereafter, an etching process adapted to remove the first semiconductor material in the layer 306 formed in the first portion 320 of the semiconductor structure 300 as well as the second semiconductor material in the layer 303 provided in the second portion 321 is performed. The second mask 307 protects the rest of the semiconductor structure 300 from being affected by an etchant used in the etching process.

The etching process can be stopped before the portions of the layers 303, 306 located below the openings 308, 309 are completely removed. Thus, a depth "d" of the recess 330 is smaller than a thickness "t" of the layer 306 of the first semiconductor material, and a depth d' of the recess 331 is smaller than a thickness t' of the layer 303 of the second semiconductor material. Hence, the respective semiconductor material is provided both on the bottom and at the sidewalls of each of the recesses 330, 331. In some embodiments, an etch rate of the first semiconductor material may be substantially equal to an etch rate of the second semiconductor material. Thus, the depth d of the first recess 330 may be approximately equal to the depth d' of the second recess 331. In other embodiments, the recesses 330, 331 may have different depths.

The recesses 330, 331 need not be formed simultaneously, as described above. In other embodiments, the recesses 330, 331 may be formed successively. In such embodiments, in the formation of each of the recesses 330, 331, a mask may be formed over the semiconductor structure 300 and an etching process may be performed.

Figure 3C:
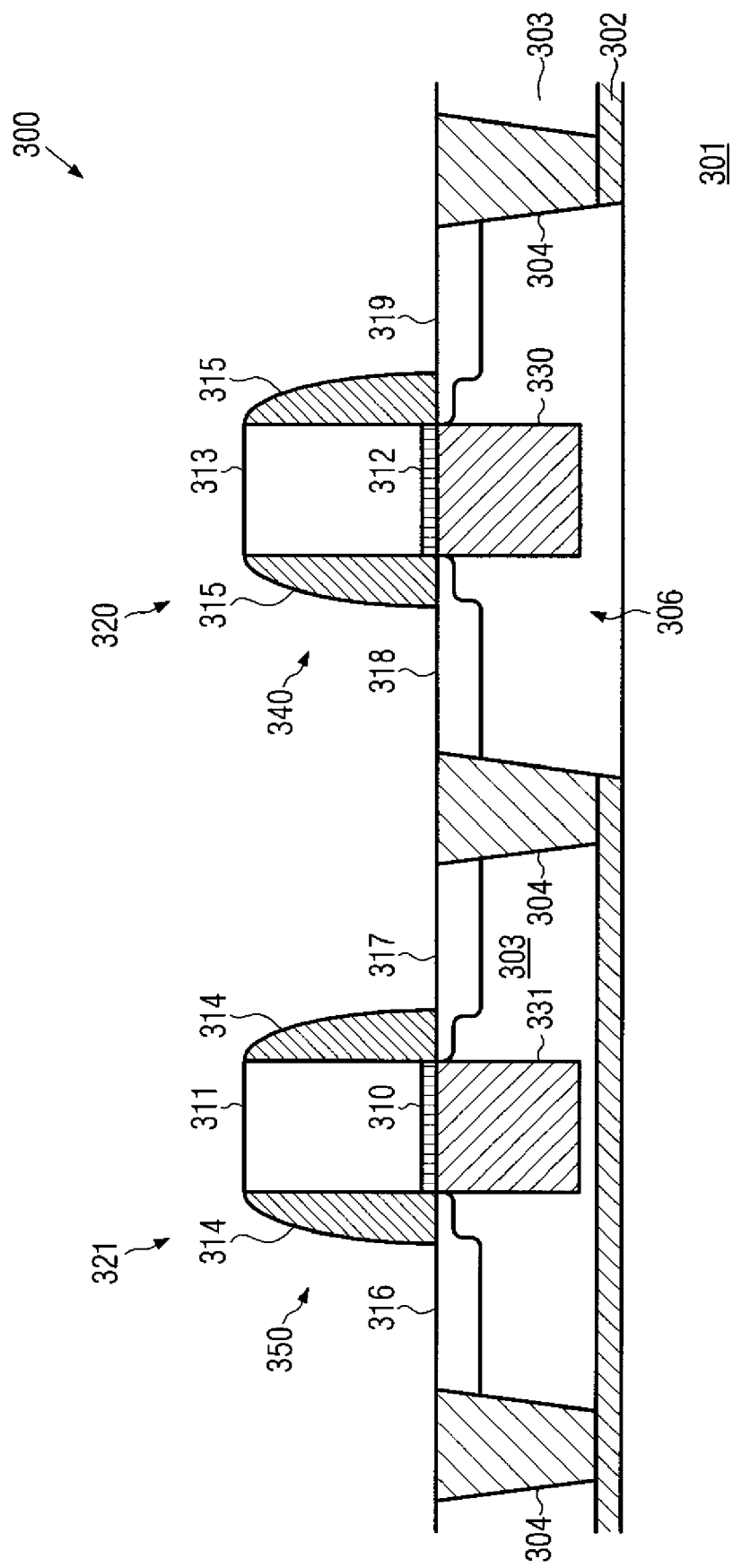

FIG. 3c shows a schematic cross-sectional view of the semiconductor structure 300 in a further stage of the manufacturing process. The first recess 330 and the second recess 331 are filled with a third semiconductor material. In some embodiments, the third semiconductor material may comprise silicon.

The recesses 330, 331 can be filled by means of a selective epitaxial growth process adapted to deposit the third semiconductor material on the first and second semiconductor material exposed on the bottom and sidewalls, respectively, of the first 330 and second 331 recess, whereas substantially no deposition of the third semiconductor material takes place on the mask 307. After the selective epitaxial growth process, the second mask can be removed by means of a known resist strip or etching process.

In other embodiments, a non-selective growth process may be employed. In such embodiments, the third semiconductor material deposited on the second mask 308, as well as the second mask 307, may be removed by means of a planarization process, for example, by means of chemical mechanical polishing. A planarization process may also be employed in other embodiments in order to smoothen the surface of the semiconductor structure 300 after filling the recesses 330, 331 with the third semiconductor material.

When the recesses 330, 331 are filled with the third semiconductor material, the arrangement of the atoms of the third semiconductor material in the first recess 330 may be influenced by the crystal lattice of the first semiconductor material in the layer 306, while the arrangement of the atoms of the third semiconductor material in the second recess 331 may be influenced by the crystal lattice of the second semiconductor material in the layer 303. In case the first semiconductor material has a lattice constant which is different from the lattice constant of the second semiconductor material, and the lattice constant of the third semiconductor material is different from those of the first and second semiconductor materials, a different intrinsic stress may be created in the material provided in the first recess 330 and the material provided in the second recess 331.

In embodiments wherein the first semiconductor material comprises silicon germanide, the second semiconductor material comprises silicon carbide and the third semiconductor material comprises silicon, a compressive stress may be created in the material filled into the first recess, and a tensile stress may be created in the material filled into the second recess. Conversely, in embodiments wherein the first semiconductor material comprises silicon carbide, the second semiconductor material comprises silicon germanide and the third semiconductor material comprises silicon, a tensile stress may be created in the material in the first recess 330 and a compressive stress may be created in the material in the second recess 331.

A first field effect transistor 340 is formed in the first portion 320 of the semiconductor structure 300, and a second field effect transistor 350 is formed in the second portion 321 of the semiconductor structure 300. The first field effect transistor 340 comprises a gate electrode 313 which is formed over the recess 330. A gate insulation layer 312 separates the gate electrode 313 from the third semiconductor material in the recess 330. The gate electrode 313 is flanked by a sidewall spacer structure 315, a source region 318 and a drain region 319. A channel region of the first field effect transistor 340 is located in the third semiconductor material provided in the recess 330.

Similarly, the second field effect transistor 350 comprises a gate electrode 311 formed over the second recess 331 filled with the third semiconductor material and separated therefrom by a gate insulation layer 310. The gate electrode 311 is flanked by a sidewall spacer structure 314, a source region 316 and a drain region 317. A channel region of the second field effect transistor 350 is located in the third semiconductor material provided in the recess 331.

The gate electrodes 311, 313, the gate insulation layers 310, 312, the sidewall spacer structures 314, 315, the source regions 316, 318 and the drain regions 317, 319 may be formed by means of methods of photolithography, oxidation, deposition, etching and ion implantation well known to persons skilled in the art. Advanced known alignment methods may be used to align the gate electrode 313 with the recess 330 and to align the gate electrode 311 with the recess 331.

The first field effect transistor 340 and the second field effect transistor 350 may be transistors of a different type. In embodiments wherein the first semiconductor material comprises silicon germanide and the second semiconductor material comprises silicon carbide, the first field effect transistor 340 may be a P-type transistor having a channel region subject to a compressive stress and the second field effect transistor 350 may be an N-type transistor having a channel region subject to a tensile stress.

Conversely, in embodiments wherein the first semiconductor material comprises silicon carbide and the second semiconductor material comprises silicon germanide, the first field effect transistor 340 may be an N-type transistor and the second field effect transistor 350 may be a P-type transistor. In still further embodiments, other combinations of the materials used as the first and second semiconductor material and the types of the first and second field effect transistors may be used.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:
   providing a substrate comprising a first semiconductor material, and a layer of a second semiconductor material positioned above said first semiconductor material;
   removing a portion of said layer of second semiconductor material located over a first portion of said substrate, wherein a portion of said layer of second semiconductor material located over a second portion of said substrate is not removed;
   forming a layer of the first semiconductor material over said first portion of said substrate;
   forming a first recess in the layer of the first semiconductor material formed over the first potion of the substrate;
   forming a second recess in said layer of second semiconductor material over said second portion of said substrate;
   filling said first recess and said second recess with a third semiconductor material; and
   forming a first gate electrode over said first recess and a second gate electrode over said second recess.

2. The method of claim 1, wherein one of said first semiconductor material and said second semiconductor material comprises silicon germanide and the other of said first semiconductor material and said second semiconductor material comprises silicon carbide.

3. The method of claim 1, wherein said third semiconductor material comprises silicon.

4. The method of claim 1, wherein a layer of an electrically insulating material is provided between said substrate and said layer of said second semiconductor material.

5. The method of claim 1, wherein said first recess and said second recess are formed simultaneously.

6. The method of claim 5, wherein said formation of said first recess and said second recess comprises:
   forming a mask over said substrate, wherein said mask does not cover portions of said substrate wherein said first recess and said second recess are to be formed; and
   performing an etching process adapted to remove said first semiconductor material and said second semiconductor material, said mask protecting portions of said substrate below said mask from being etched.

* * * * *